United States Patent
Oswal et al.

(10) Patent No.: US 7,884,746 B2
(45) Date of Patent: Feb. 8, 2011

(54) NOISE LIMITATION OF A SIGNAL DEPENDENT MULTIBIT DIGITAL TO ANALOG SIGNAL CONVERSION

(75) Inventors: Sandeep Oswal, Bangalore (IN); Jagannathan Venkataraman, Bangalore (IN)

(73) Assignee: Texas Instruments Incorporated, Dallas, TX (US)

(*) Notice: Subject to any disclaimer, the term of this patent is extended or adjusted under 35 U.S.C. 154(b) by 16 days.

(21) Appl. No.: 12/422,304

(22) Filed: Apr. 13, 2009

(65) Prior Publication Data

US 2009/0257558 A1 Oct. 15, 2009

Related U.S. Application Data

(60) Provisional application No. 61/044,144, filed on Apr. 11, 2008.

(51) Int. Cl.
*H03M 1/66* (2006.01)
(52) U.S. Cl. .................... 341/144; 341/143; 341/172
(58) Field of Classification Search .............. 341/144, 341/143, 172
See application file for complete search history.

(56) References Cited

U.S. PATENT DOCUMENTS

| 6,252,531 | B1 | 6/2001 | Gordon et al. | |
|---|---|---|---|---|
| 6,340,945 | B1* | 1/2002 | Hauptmann et al. | 341/172 |
| 6,707,409 | B1* | 3/2004 | Ignjatovic et al. | 341/143 |
| 6,842,129 | B1* | 1/2005 | Robinson | 341/143 |
| 2007/0164884 | A1* | 7/2007 | Ihs | 341/143 |
| 2008/0303703 | A1* | 12/2008 | Josefsson et al. | 341/143 |

* cited by examiner

*Primary Examiner*—Jean B Jeanglaude
(74) *Attorney, Agent, or Firm*—Steven A. Shaw; W. James Brady; Frederick J. Telecky, Jr.

(57) ABSTRACT

Several methods and a system of noise limitation of a signal dependent multibit digital to analog signal conversion are disclosed. An exemplary embodiment provides a method that includes receiving an output of a multibit analog to digital circuit of a continuous time sigma delta converter. The method further includes limiting a noise generation by adaptively selecting a digital to analog converter element out of a plurality of digital to analog converter elements in accordance with an input signal magnitude. In addition, the method includes implementing a selected digital to analog converter element to generate an analog signal.

18 Claims, 6 Drawing Sheets

NOISE LIMITATION OF A SIGNAL DEPENDENT MULTIBIT DIGITAL TO ANALOG SIGNAL CONVERSION

CLAIM OF PRIORITY

This Utility Patent Application claims priority from U.S. Provisional patent application No. 61/044,144 filed on Apr. 11, 2008.

FIELD OF TECHNOLOGY

This disclosure relates generally to integrated circuits and more particularly to noise limitation of a signal dependent multibit digital to analog signal conversion.

BACKGROUND

An analog signal can be converted to a digital signal using a continuous time sigma delta converter. A type of continuous time sigma delta converter uses substantially all elements of a digital to analog converter for any input signal to generate a feedback signal. In some cases, the use of substantially all elements of the digital to analog converter generates a larger noise. The noise can cause an error to occur that results in a reduced quality of the conversion of the analog signal to the digital signal.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

Several methods and a system of noise limitation of a signal dependent multibit digital to analog signal conversion are disclosed.

An exemplary embodiment provides a method that includes receiving an output of a multibit analog to digital circuit of a continuous time sigma delta converter. The method further includes limiting a noise generation by adaptively selecting a digital to analog converter element out of a plurality of digital to analog converter elements in accordance with an input signal magnitude. In addition, the method includes implementing a selected digital to analog converter element to generate an analog signal.

An exemplary embodiment provides a system. The system includes an integrator circuit of a continuous time sigma delta converter. The method further includes a multibit analog to digital converter circuit coupled to the integrator circuit. The multibit analog to digital circuit generates a digital signal when it receives an integrator signal from the integrator circuit. In addition, the system includes a digital to analog converter circuit coupled to the multibit analog to digital converter circuit and the integrator circuit. A digital to analog converter element is adaptively selected out of a plurality of digital to analog converter elements in accordance with a digital signal magnitude to limit a noise generation.

An exemplary embodiment provides a method. The method includes using between two bits and sixteen bits of a multibit analog to digital circuit to generate a digital output. The method further includes receiving the digital output in a digital to analog converter. In addition, the method includes limiting a noise generation by adaptively selecting a digital to analog converter element comprised of a capacitor out of a plurality of digital to analog converter elements in accordance with an input signal magnitude. Each capacitor includes substantially the same capacitance. The method includes implementing a selected digital to analog converter element to generate an analog signal. Further, the method includes decoupling an extraneous digital to analog converter element from the continuous time sigma delta converter input. The method includes converting a digital signal below a threshold level to an analog signal using less than all of the elements of the digital to analog converter. The method also includes generating a combined signal by merging the analog signal with an input signal. The combined signal is received by an integrator circuit of the continuous time sigma delta converter. The output of the integrator circuit is coupled to an input of the multibit analog to digital converter circuit.

The methods and systems disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying Drawings and from the Detailed Description that follows.

BRIEF DESCRIPTION OF THE VIEWS OF DRAWINGS

Example embodiments are illustrated by way of example and not limitation in the figures of the accompanying drawings, in which like references indicate similar elements and in which.

Other features of the present embodiments will be apparent from the accompanying Drawings and from the Detailed Description that follows.

DETAILED DESCRIPTION

Several methods and a system of noise limitation of a signal dependent multibit digital to analog signal conversion are disclosed. Although the embodiments have been described with reference to specific example embodiments, it will be evident that various modifications and changes may be made to these embodiments without departing from the broader spirit and scope of the various embodiments.

Figure 1:
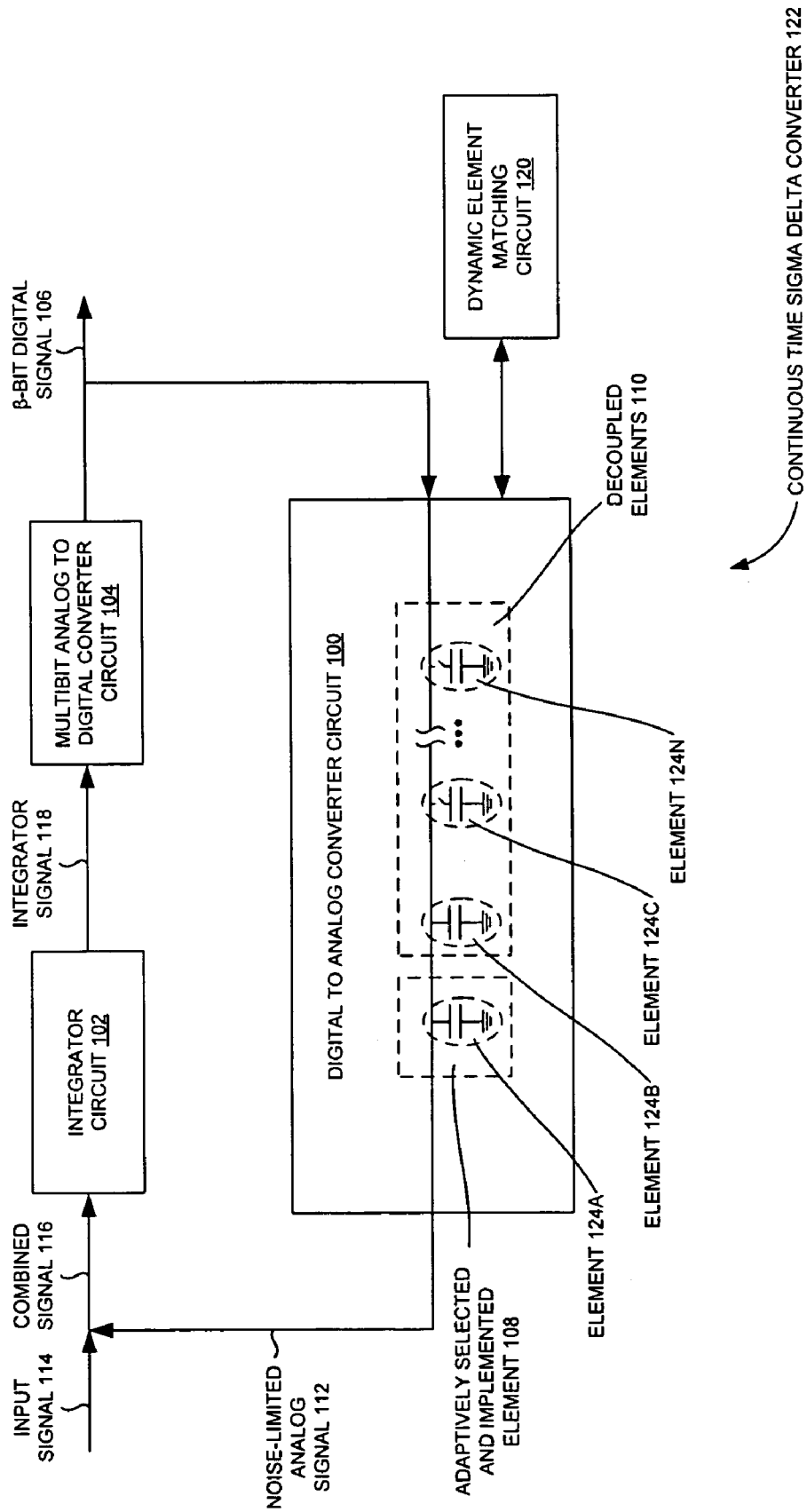
FIG. 1 is a schematic view that illustrates noise limitation of a signal dependent multibit digital to analog signal conversion, according to one embodiment.

FIG. 1 is a schematic view that illustrates noise limitation of a signal dependent multibit digital to analog signal conversion, according to one embodiment. Particularly, FIG. 1 illustrates a digital to analog converter circuit 100, an integrator circuit 102, a multibit analog to digital converter circuit 104, a β-bit digital signal 106, adaptively selected and implemented element 108, decoupled elements 110, a noise-limited analog signal 112, an input signal 114, a combined signal 116, an integrator signal 118, a dynamic element matching circuit 120, a continuous time sigma delta converter 122, and element 124A-124N, according to one embodiment.

Figure 3:
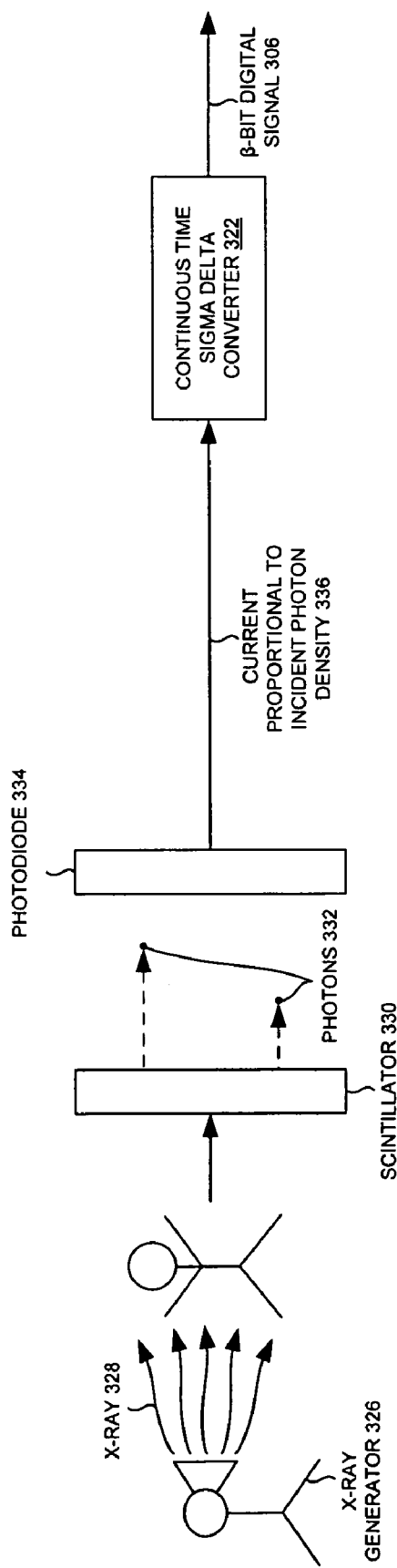
FIG. 3 is a schematic view that illustrates generating a current proportional to an incident photon density, according to one embodiment.

The input signal 114 may be the signal received by the continuous time sigma delta converter 122. The input signal 114 may be the current proportional to the incident photon density 336. The input signal may the current generated by the photodiode 334 (as shown in FIG. 3). The integrator circuit 102 may receive a combined signal 116, which may include an input signal 114 and a noise-limited analog signal 112. The integrator circuit 102 may be coupled to a multibit analog to digital converter circuit 104, and it may communicate an integrator signal 118 to the multibit analog to digital converter circuit 104. The multibit analog to digital converter circuit 104 may output a β-bit digital signal 106. β may represent the number of bits used by the multibit analog to digital converter circuit 104. The multibit analog to digital converter circuit 104 may be coupled to the digital to analog converter circuit 100, which may be coupled to the dynamic element matching circuit 120 and the integrator circuit 102.

The digital to analog converter circuit 100 may include elements 124A-124N, which may be included in the adaptively selected and implemented elements 108 and the decoupled elements 110. The elements 124A-124N included in the adaptively selected and implemented elements 108 may be coupled to the input of the integrator circuit 102 and may be used to generate the noise-limited analog signal 112. The elements 124A-124N included in the decoupled elements 110 may be disconnected from the input of the integrator circuit 102.

In an embodiment, the digital to analog converter circuit 100 receives an output of the multibit analog to digital converter circuit 104 of the continuous time sigma delta converter 122. The output may be the β-bit digital signal 106, and β may represent any natural number greater than one. The digital to analog converter circuit 100 may include two or more elements 124A-124N. Each element 124A-124N may include a capacitor connected to +Vref and a capacitor connected to −Vref. The capacitors may each have the same capacitance or varying capacitances.

The total number of elements 124A-124N that are used by the digital to analog converter circuit 100 may be determined by the number of bits used for the multibit analog to digital converter circuit 104. The analog to digital converter circuit 104 may use between two and sixteen bits to generate a digital output, although alternate embodiments may use any number of bits.

The number of elements 124A-124N used by the digital to analog converter circuit 100 may be two to the power β, where β is the number of bits used for the multibit analog to digital converter circuit 104. For example, when a four bit analog to digital converter circuit 104 generates a digital signal, sixteen elements 124A-124N may be used by the digital to analog converter circuit 100. In another embodiment, any number elements 124A-124N may be used in combination to convert a digital signal to an analog signal. Each element 124A-124N may correspond to the analog signal equivalent of one of the possible output values of the multibit analog to digital converter circuit 104. An element 124A may be used to generate a current substantially equal to 0 μA. In the embodiment, each element 124A-124N may include a capacitor.

In an embodiment, the digital to analog converter circuit 100 limits a noise generation by adaptively selecting a digital to analog converter circuit 100 element 124A-124N out of a plurality of digital to analog converter circuit 100 elements 124A-124N, in accordance with an β-bit digital signal 106 that is proportional to the input signal 114. Substantially all elements 124A-124N may be activated when the input signal 114 is full scale, but fewer elements 124A-124N may be activated when the input signal 114 is less than full scale. In some cases, to represent a low input signal 114 such as 0, half the elements 124A-124N are connected to +vref and the other half of the elements 124A-124N are connected to −vref. This may add noise from substantially all the elements 124A-124N even for low input signals. Instead, in an embodiment, the number of elements 124A-124N is chosen based on the digital to analog converter input 106, thus reducing the noise contribution. The noise included in the noise-limited analog signal 112 may be limited by reducing the number of coupled elements 124A-124N and increasing the number of decoupled elements 110.

The adaptive selection of an element 124A-124N may be affected by the dynamic element matching circuit 120, which may dynamically select an element 124A-124N to limit a nonlinearity caused by a mismatch in the digital to analog converter element 124A-124N. Each element 124A-124N may generate a particular error when it is used to generate the noise-limited analog signal 112. The dynamic element matching circuit 120 may distribute the selection of elements 124A-124N to limit the extent to which one of the elements 124A-124N is selected and implemented more frequently than others. The distribution may be random, a predetermined pattern, a selection based on an algorithm, or any other method of distributing the selection of elements 124A-124N. The nonlinearity prevented through the use of the dynamic element matching circuit 120 may include harmonics in which signals that are generated using the same element 124A-124N incorporate associated errors.

In an embodiment, the selected element is implemented to generate an analog signal. As illustrated in FIG. 1, the adaptively selected and implemented element 108 may include element 124A. Implementing an element 124A-124N may include coupling one or more capacitors to the input of the integrator circuit 102. The coupled capacitor may transfer a charge pulse that generates the noise-limited analog signal 112. Each implemented element 124A-124N may contribute to a noise of the noise-limited analog signal 112 when it is coupled to the input of the integrator circuit 102. The noise generated by the implemented element 124A-124N may be proportional to the square root of the capacitance of element 124A. The noise generated by the digital to analog converter circuit 100 may be limited by restricting the number of adaptively selected and implemented elements 124A-124N. The noise generated by the digital to analog converter circuit 100 may be limited by increasing the number of decoupled elements 110.

Figure 2:
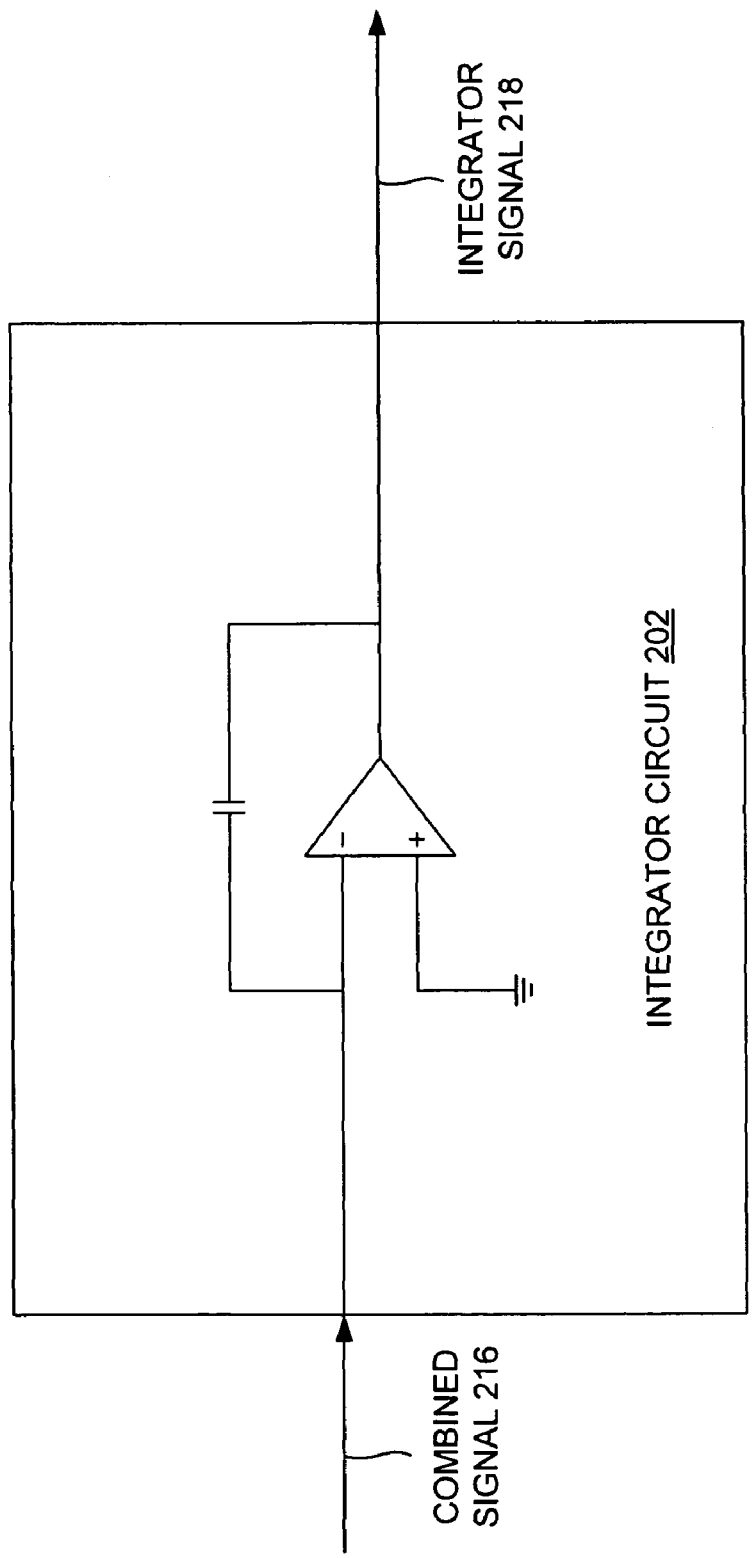
FIG. 2 is an exploded view of an integrator circuit, according to another embodiment.

FIG. 2 is an exploded view of an integrator circuit, according to another embodiment. In particular, FIG. 2 illustrates an integrator circuit 202, a combined signal 216, and an integrator signal 218, according to one embodiment. The combined signal 216 may be the combined signal 116. The integrator circuit 202 may receive the combined signal 216, which may be a current that is merged with charge pulses from a digital to analog converter circuit 100. The integrator circuit 202 may integrate the combined signal 216 to generate an integrated voltage, which may be the integrator signal 218.

FIG. 3 is a schematic view that illustrates generating a current proportional to an incident photon density, according to one embodiment. In particular, FIG. 3 illustrates an x-ray generator 326, an x-ray 328, a scintillator 330, photons 332, a photodiode 334, a current proportional to incident photon density 336, a continuous time sigma delta converter 322, and a β-bit digital signal 306, according to one embodiment.

FIG. 3 illustrates an x-ray generator 326 projecting x-rays 328. The x-ray generator 326 may be used in a computed tomography system to project x-rays 326 at a person or an object. The x-rays 326 may pass through the person, and a part of the x-ray 328 flux may be converted to light photons 334 by the scintillator 330. The photons 332 may be captured by a photodiode 334 that is coupled to the scintillator 330. The photodiode 334 may generate the current proportional to the incident photon density 334, which may be received by the continuous time sigma delta converter 322, which may be the continuous time sigma delta converter 122. The continuous time sigma delta converter 322 may generate the β-bit digital signal 306 as an output.

The continuous time sigma delta converter 322 may integrate the current proportional to the incident photon density 334 using a feedback capacitor of an integrator circuit 102. The integrator circuit 102 may generate an integrated voltage, which may be the integrator signal 118. The integrated voltage may be converted to the β-bit digital signal 306 using the multibit analog to digital converter circuit 104. The use of a multibit quantizer may reduce a tone problem that may be associated with a single bit quantizer. In addition, the use of a signal dependent multibit digital to analog signal conversion may help limit noise generation for lower input signal 114 ranges, which may help improve images for computed tomography.

Figure 4A:
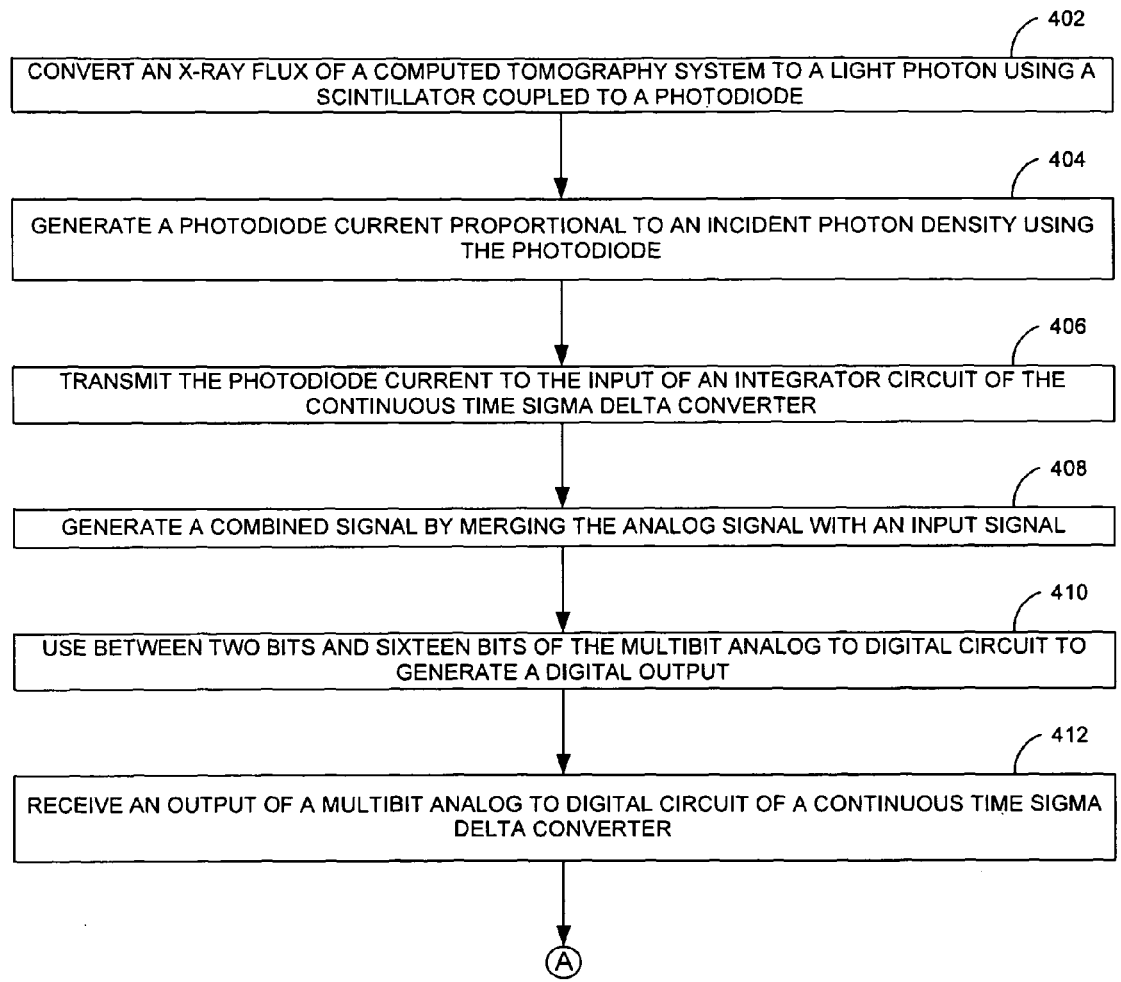
FIGS. 4A and 4B is a process flow that illustrates limiting a noise generation by adaptively selecting a digital to analog converter element out of one or more digital to analog converter elements, according to one embodiment.
Figure 4B:
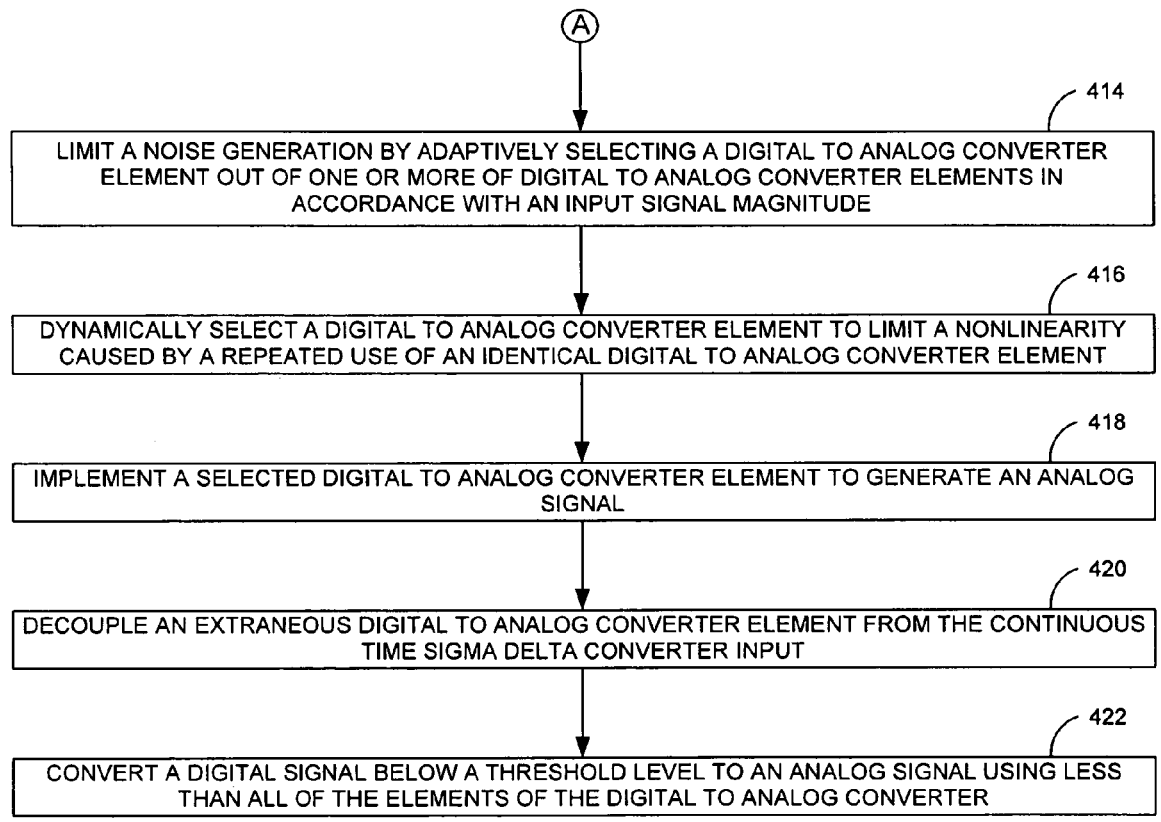

FIGS. 4A and 4B is a process flow that illustrates limiting a noise generation by adaptively selecting a digital to analog converter element out of one or more digital to analog converter elements, according to one embodiment. In operation 402, an x-ray 328 flux of a computed tomography system is converted to a light photon 332 using a scintillator 330 coupled to a photodiode 334. In operation 404, a photodiode 334 current proportional to an incident photon density 336 is generated using the photodiode 334. In operation 406, the photodiode 334 current is transmitted to the input of an integrator circuit 102 of the continuous time sigma delta converter 122. In operation 408, a combined signal 116 is generated by merging the noise-limited analog signal 112 with the input signal 114. In operation 410, between two bits and 16 bits of the multibit analog to digital converter circuit 104 is used to generate the β-bit digital signal 106.

In operation 412, an output of a multibit analog to digital converter circuit 104 of a continuous time sigma delta converter 122 is received. In operation 414, a noise generation is limited by adaptively selecting a digital to analog converter element out of one or more digital to analog converter elements in with an input signal 114 magnitude. In operation 416, a digital to analog converter circuit element 124A-124N is dynamically selected by the dynamic element matching circuit 120 to limit a nonlinearity caused by mismatch of digital to analog converter circuit element 124A-124N. In operation 418, a selected digital to analog converter circuit element 124A-124N is implemented to generate a noise-limited analog signal 112. In operation 420, an extraneous digital to analog converter element is decoupled from the continuous time sigma delta converter input. In operation 422, a digital signal below a threshold level is converted to an analog signal using less than all of the elements 124A-N of the digital to analog converter circuit 100.

Figure 5:
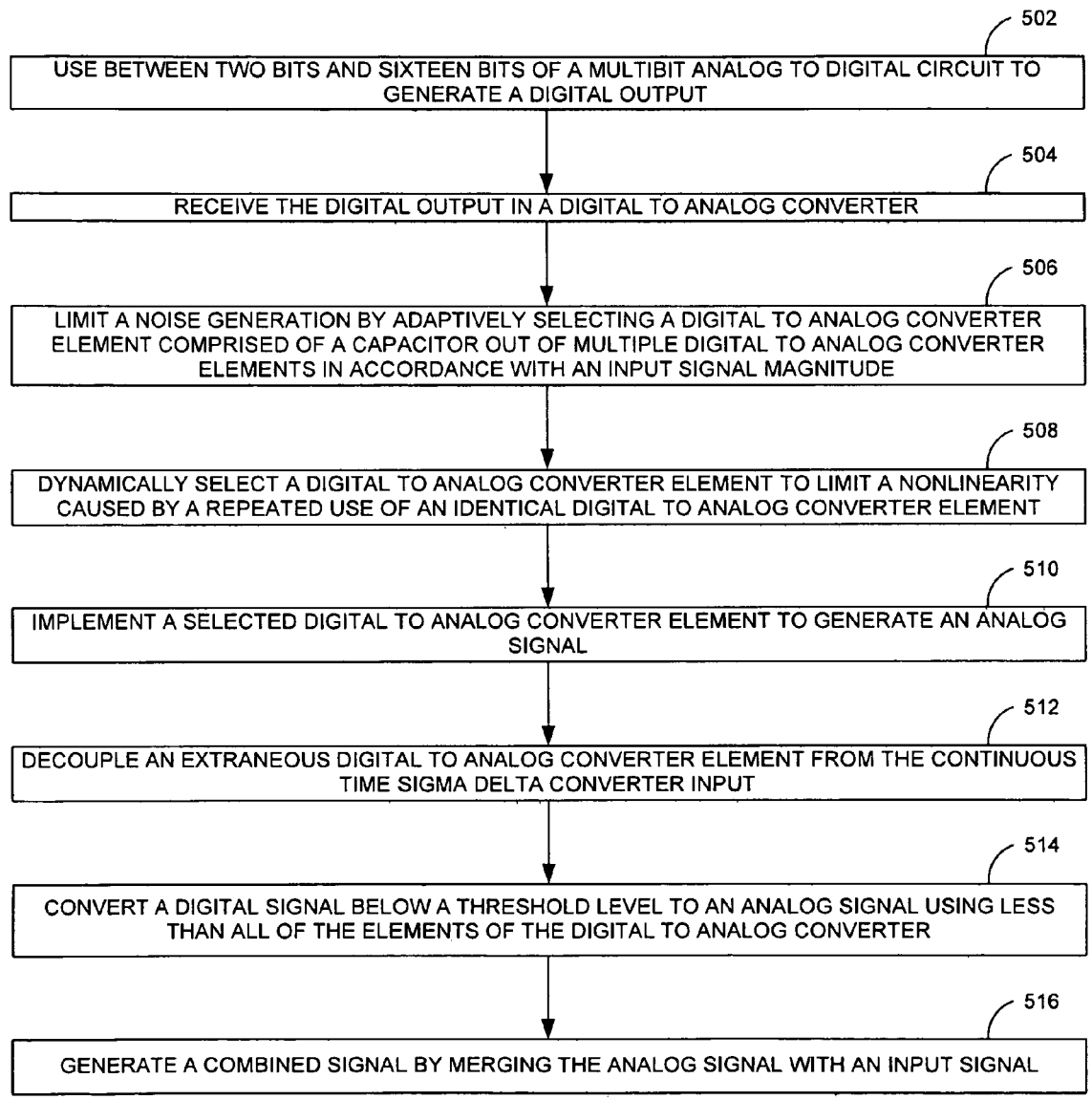
FIG. 5 is a process flow that illustrates using between two bits and sixteen bits of a multibit analog to digital circuit to generate a digital output, according to another embodiment.

FIG. 5 is a process flow that illustrates using between two bits and sixteen bits of a multibit analog to digital circuit to generate a digital output, according to another embodiment. In operation 502, between two bits and sixteen bits of a multibit analog to digital circuit 104 are used to generate a digital output. For example, the digital output may be the β-bit digital signal 106, and β may be the number of bits used by the multibit analog to digital circuit 104. In operation 504, the digital output may be received in a digital to analog converter. For example, the β-bit digital signal 106 may be received by the digital to analog converter circuit 100. In operation 506, a noise generation may be limited by adaptively selecting a digital to analog converter element 124A-N out of multiple digital to analog converter elements 124A-N in accordance with a B-bit digital signal 106 which is proportional to the input signal 114 magnitude. For example, an element 124A may be part of the group of adaptively selected and implemented elements 108 that may be used to generate a noise-limited analog signal 112 that corresponds in magnitude with the input signal 114.

In operation 508, a digital to analog converter element may be dynamically selected to limit a nonlinearity caused by mismatch of a digital to analog converter element. For example, an element 124A may be dynamically selected instead of element 124C to prevent a repeated use of element 124C that may result in a nonlinearity of noise-limited analog signals 112. In operation 510, a selected digital to analog converter element may be implemented to generate an analog signal. For example, a capacitor of an element 124 may be coupled to the input of the integrator 102 to transmit a current to be merged with the input signal 114. In operation 512, an extraneous digital to analog converter element 124A-N may be decoupled from the continuous time sigma delta converter input. For example, element 124N may be decoupled from the continuous time sigma delta converter input to prevent it from contributing current to the noise-limited analog signal 112 if it has not been adaptively selected and implemented. In operation 514, a digital signal below a threshold level may be converted to an analog signal using less than all of the elements 124A-N of the digital to analog converter circuit 100. For example, for an input signal 114 that is less than a full signal, element 124A and element 124B may be used to generate the noise-limited analog signal 112 that corresponds to the input signal 114.

Although the present embodiments have been described with reference to specific example embodiments, it will be evident that various modifications and changes may be made to these embodiments without departing from the broader spirit and scope of the various embodiments. For example, the various systems, devices, apparatuses, and circuits, etc. described herein may be enabled and operated using hardware circuitry, firmware, software or any combination of hardware, firmware, or software embodied in a machine readable medium. For example, the various electrical structure and methods may be embodied using transistors, logic gates, application specific integrated (ASIC) circuitry or Digital Signal Processor (DSP) circuitry.

In addition, it will be appreciated that the various operations, processes, and methods disclosed herein may be embodied in a machine-readable medium or a machine accessible medium compatible with a data processing system, and may be performed in any order. Accordingly, the Specification and Drawings are to be regarded in an illustrative rather than a restrictive sense.

What is claimed is:
1. A method, comprising:
receiving an output of a multibit analog to digital converter circuit of a continuous time sigma delta converter;
limiting a noise generation, in an X-ray flux environment, using dynamic element matching comprising:
dynamically selecting a first plurality of digital to analog converter elements of a multibit digital to analog converter to be coupled to an integrator circuit;
dynamically selecting a second plurality of digital to analog converter elements of a multibit digital to ana- log converter to be decoupled from the input of the continuous time sigma delta converter;

implementing the first plurality of digital to analog converter elements by coupling the first plurality of digital to analog converter elements to an input of the continuous time sigma delta converter and disconnecting the second plurality of digital to analog converter elements from the input of the continuous time sigma delta converter; and generating an analog signal using the integrator circuit.

2. The method of claim 1, further comprising:

generating a combined signal by merging the analog signal with an input signal, wherein the combined signal is received by an integrator circuit of the continuous time sigma delta converter.

3. The method of claim 2, wherein the output of the integrator circuit is coupled to an input of the multibit analog to digital converter circuit.

4. The method of claim 1, wherein the digital to analog converter circuit element is comprised of a capacitor.

5. The method of claim 4, wherein each of the digital to analog converter circuit elements are comprised of a capacitor with substantially the same capacitance.

6. The method of claim 1, further comprising:

using between two bits and sixteen bits of the multibit analog to digital circuit to generate a digital output.

7. The method of claim 1, further comprising:

converting a digital signal below a threshold level to an analog signal using less than all of the elements of the digital to analog converter.

8. The method of claim 6, wherein a number of capacitors of the digital to analog converter circuit is two to a power $\beta$, wherein $\beta$ is a number of bits used by the multibit analog to digital converter circuit.

9. The method of claim 1, further comprising dynamically selecting a digital to analog converter element to limit a nonlinearity caused by a repeated use of an identical digital to analog converter element.

10. The method of claim 1, further comprising:

converting an x-ray flux of a computed tomography system to a light photon using a scintillator coupled to a photodiode;

generating a photodiode current proportional to an incident photon density using the photodiode;

transmitting the photodiode current to the input of an integrator circuit of the continuous time sigma delta converter.

11. A system, comprising:

an integrator circuit of a continuous time sigma delta converter;

a multibit analog to digital converter circuit coupled to the integrator circuit, wherein the multibit analog to digital circuit generates a digital signal when it receives an integrator signal from the integrator circuit;

a digital to analog converter circuit coupled to the multibit analog to digital converter circuit and the integrator circuit; and a dynamic element matching circuit, wherein a digital to analog converter element is adaptively selected and implemented out of a plurality of digital to analog converter elements in accordance with a digital signal magnitude to limit a noise generation.

12. The system of claim 11, wherein the digital to analog converter element is adaptively selected when the digital signal is received by a digital to analog converter, and wherein the digital to analog converter element is implemented to generate an analog signal after it is selected.

13. The system of claim 12, wherein a combined signal is generated by merging the analog signal with an input signal, wherein the combined signal is received by an integrator circuit of the continuous time sigma delta converter.

14. The system of claim 13, wherein the output of the integrator circuit is coupled to an input of the multibit analog to digital converter circuit.

15. The system of claim 11, wherein the digital to analog converter circuit element is comprised of a capacitor.

16. The system of claim 15, wherein each of the digital to analog converter circuit elements are comprised of a capacitor, and wherein each capacitor is comprised of substantially the same capacitance.

17. A method comprising:

using between two bits and sixteen bits of a multibit analog to digital converter circuit to generate a digital output;

receiving the digital output in a digital to analog converter;

limiting a noise generation, in an X-ray flux environment, by adaptively selecting a digital to analog converter element comprised of a capacitor out of a plurality of digital to analog converter elements in accordance with an input signal magnitude, wherein each capacitor is comprised of substantially the same capacitance;

using dynamic element matching comprising:

dynamically selecting a first plurality of digital to analog converter elements of a multibit digital to analog converter to be coupled to an integrator circuit, wherein each element is comprised of a capacitor;

dynamically selecting a second plurality of digital to analog converter elements of a multibit digital to analog converter to be decoupled from a continuous time sigma delta converter input, wherein each element is comprised of a capacitor;

implementing the first plurality of digital to analog converter elements to generate an analog signal;

decoupling the second plurality of digital to analog converter elements from the continuous time sigma delta converter input;

converting a digital signal below a threshold level to an analog signal using less than all of the elements of the digital to analog converter; and generating a combined signal by merging the analog signal with an input signal, wherein the combined signal is received by an integrator circuit of the continuous time sigma delta converter, wherein the output of the integrator circuit is coupled to an input of the multibit analog to digital converter circuit.

18. The method of claim 17, further comprising dynamically selecting a digital to analog converter element to limit a nonlinearity caused by a repeated use of an identical digital to analog converter element.

* * * * *